United States Patent
Eto

(10) Patent No.: US 8,344,484 B2
(45) Date of Patent: Jan. 1, 2013

(54) SEMICONDUCTOR DEVICE

(75) Inventor: Toyonori Eto, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 71 days.

(21) Appl. No.: 12/968,747

(22) Filed: Dec. 15, 2010

(65) Prior Publication Data

US 2011/0156263 A1   Jun. 30, 2011

(30) Foreign Application Priority Data

Dec. 24, 2009   (JP) ................................. 2009-291848

(51) Int. Cl.
*H01L 29/06* (2006.01)

(52) U.S. Cl. .................. 257/622; 257/E23.01; 257/619; 257/620; 438/113; 438/458; 438/462

(58) Field of Classification Search ............ 257/E23.01, 257/619, 620, 622, 750, 758, 773, 774, E23.238, 257/E23.131; 438/113, 458, 459, 462, 622, 438/977
See application file for complete search history.

(56) References Cited

U.S. PATENT DOCUMENTS

| 8,058,151 | B2 * | 11/2011 | Jeng et al. | 438/460 |
| 2004/0147097 | A1 * | 7/2004 | Pozder et al. | 438/584 |
| 2004/0169258 | A1 | 9/2004 | Iijima | |
| 2005/0026397 | A1 * | 2/2005 | Daubenspeck et al. | 438/465 |
| 2005/0093169 | A1 * | 5/2005 | Kajita | 257/774 |
| 2005/0269702 | A1 | 12/2005 | Otsuka | |
| 2006/0103025 | A1 | 5/2006 | Furusawa et al. | |
| 2009/0146260 | A1 | 6/2009 | Eto | |

FOREIGN PATENT DOCUMENTS

| JP | 9-45766 A | 2/1997 |
| JP | 2004-193382 A | 7/2004 |
| JP | 2006-140404 A | 6/2006 |
| JP | 2009-141074 A | 6/2009 |
| WO | WO 2004/097917 A1 | 11/2004 |

* cited by examiner

*Primary Examiner* — Chris Chu
(74) *Attorney, Agent, or Firm* — Foley & Lardner LLP

(57) ABSTRACT

A semiconductor device may include, but is not limited to: a semiconductor substrate having an element formation region and a dicing region; an element layer over the element formation region and the dicing region; and a multi-layered wiring structure over the dicing region. The multi-layered wiring structure extends upwardly from the element layer. The multi-layered wiring structure has a groove penetrating the multi-layered wiring structure.

20 Claims, 8 Drawing Sheets

SEMICONDUCTOR DEVICE

BACKGROUND OF THE INVENTION

1. Field of the Invention

The present invention relates to a semiconductor device.

Priority is claimed on Japanese Patent Application No. 2009-291848, filed Dec. 24, 2009, the content of which is incorporated herein by reference.

2. Description of the Related Art

Recently, semiconductor devices having a multi-layered wiring structure have been manufactured. Such a semiconductor device has a structure such that wires are provided on a surface of each layer, and contact plugs electrically connects wires on different layers. The wires are formed with high density, thereby making manufacturing processes complicated.

FIG. 1 illustrates a general method of manufacturing a semiconductor wafer 2, on which a semiconductor device having a multi-layered wiring structure of a related art. The semiconductor wafer 2 includes a dicing region C, which defines a region including a chip region A and a fuse element formation region B.

Firstly, semiconductor elements, such as a MOS transistor 201a and a capacitor 201d, are formed on a silicon substrate 200. Then, a single-or-multi-layered inter-layer insulating film 201b is formed over the semiconductor elements. Thus, an element layer 201 is formed. As long as the above conditions are satisfied and a fuse element for remedying defective chips is included in the wiring structure, not only a DRAM (Dynamic Random Access Memory), but also a memory element such as SRAM (Static Random Access Memory) and a FLASH memory, a logic circuit, or the like may be formed as the semiconductor wafer 2.

Then, a contact plug 201c is fowled so as to vertically penetrate the inter-layer insulating film 201b in the fuse element formation region B and the dicing region C. The contact plug 201c is made of a conductive material, such as Titanium (Ti) and Tungsten (W). The contact plug 201c connects the MOS transistor 201a and a multi-layered structure 221 (a first wiring structure 210, a second wiring structure 220, and a third wiring structure 230) that will be explained later.

Then, a first silicon nitride film 202 and an inter-layer film 203 are sequentially formed over the chip region A, an upper surface of the contact plug 201c in the fuse element formation region B and the dicing region C, and the uppermost inter-layer insulating film 201b. The inter-layer film 203 includes a first low-k film (low dielectric material film) made of silicon (Si), carbon (C), oxygen (O), or the like.

The reason that the low-k film is formed over the contact plug 201c is to reduce parasitic capacitance and thereby to prevent a delay of a signal through the contact plug 201c. The low-k film is defined in this specification as a film having a lower dielectric constant than that of a pure silicon oxide film. Specifically, the low-k film is defined as a film having a k-value that is smaller than 3.9. Instead of a single-layered low-k film, the inter-layer film 203 may be a multi-layered structure including a low-k film and a thin silicon oxide film over the low-k film. The thin silicon oxide film may be formed by a plasma CVD (Chemical Vapor Deposition) process. The thin silicon oxide film is formed to achieve moisture absorption and to prevent scratching in the CMP process.

Then, a first contact hole 204a, which penetrates the first silicon nitride film 202 and the first inter-layer film 203, is formed. Then, a barrier metal film and a copper film are sequentially formed in this order so as to fill the first contact hole 204a and to cover the inter-layer film 203 including the first low-k film. The barrier metal film is made of Ti, Ta (tantalum), Mn (manganese), or the like. The barrier metal film prevents copper from diffusing into the inter-layer insulating film 201b. Thus, deterioration of elements due to diffusion of copper can be prevented.

Then, the barrier metal film over the first inter-layer film 203 and the copper film over the barrier metal film are polished using a CMP (Chemical Mechanical Polishing) method to form a first wire (Cu wire) 204. Thus, a first wiring structure 210, which includes the first silicon nitride film 202, the first inter-layer film 203, and the first wire 204, is formed. In the fuse element formation region B, the first wire 204 functions as a fuse element. When the first wire 204 is diced by laser irradiation or the like, a predetermined circuit operation can be carried out.

Then, a first diffusion prevention insulating film 205, a second inter-layer insulating film 206, and a second wire 207 are formed in a similar manner as the process of forming the first wiring structure 210. Thus, a second wiring structure 220, which includes the first diffusion prevention insulating film 205, the second inter-layer film 206, and the second wire 207, is formed over the first wiring structure 210.

The first diffusion prevention insulating film 205 is provided to prevent diffusion of copper. The first diffusion prevention insulating film 205 may be made of, for example, a silicon nitride film. Instead, a silicon nitride film containing carbon (C) to reduce the dielectric constant may be used. The first and second wires 204 and 207 are collectively connected to the contact plug using a dual damascene method. However, the dual damascene method is a known method, and therefore an explanation thereof is omitted here.

Then, a second diffusion prevention insulating film 208 and a third inter-layer insulating film 209 are formed over the second wiring structure 220. Then, a third contact hole 211a is formed so as to penetrate the third inter-layer insulating film 209 and to expose the second wire 207.

Then, the third contact hole 211a is filled with Ti and W, or with Al using a reflow sputtering method at a high temperature, to form a plug. The method of forming the plug has little relation to the present invention. Therefore, the detailed explanation thereof is omitted here. A process using the reflow sputtering process is shown in the drawings of the related art and embodiments of the present invention that will be explained later.

Then, a third wire (Al wire) 211, which fills the third contact hole 211a, is formed by a sputtering method or a reflow sputtering method. The third wire 211 is made of Al or the like. The third wire 211 includes a lower portion 211b and an upper portion 211c. The lower portion 211b of the third wire 211 penetrates the third inter-layer insulating film 209 and the second diffusion prevention insulating film 208, and functions as a contact plug. The upper portion 211c extends upwardly from an upper surface of the third inter-layer insulating film 209, and functions as a wiring layer.

The reason that Al is used as the material of the third wire 211 is that Al has a great affinity for a bonding process that will be explained later. Thus, a third wiring structure 230, which includes the second diffusion prevention insulating film 208, the third inter-layer insulating film 209, and the lower portion 211b of the third wire 211, is formed. In this manner, a multi-layered wiring structure 221, which includes the first wiring structure 210, the second wiring structure 220, and the third wiring structure 230, is formed.

Then, a cover insulating film 212 is formed so as to cover the third inter-layer insulating film 209 and the upper portion 211c of the third wire 211. The cover insulating film 212 includes a silicon oxide film, a silicon nitride film, a silicon oxynitride film, or a multi-layered film including these films. Then, a polyimide layer 213 is formed so as to cover the cover insulating film 212. The polyimide layer 213 functions as a buffer for the chip.

Thus, a die seal ring 240, which includes the upper portion 211c of the third wire 211, the cover insulating film 212, and the polyimide layer 213, is formed in the dicing region. C. The die seal ring 240 surrounds a periphery of each chip including the chip region A and the fuse element formation region B, and functions as a protection ring. Then, a hole for a bonding pad (not shown) is formed. Thus, a manufacturing pre-process is completed.

As a method of manufacturing a semiconductor device having such a multi-layered wiring structure, PCT international publication No. WO 2004/097917 discloses a method of simultaneously carrying out a process of farming a groove for preventing dicing crack and a process of forming a hole for a pad.

However, the above methods have the following problems. In a manufacturing post-process as shown in FIG. 2, generally, a wafer is diced into multiple chips by using a dicing blade or laser irradiation to the dicing region C. During the dicing process, cracking K occurs on a dicing surface. Then, a different material is deposited on the dicing surface, and the cracking further proceeds between the first inter-layer film 203 and the first diffusion prevention insulating film 205 which have different Young's moduli. If the cracking K further proceeds over the die seal ring portion and reaches the chip region A, the moisture resistance of the semiconductor chip degrades, thereby causing defects of the semiconductor device.

To solve the problem, a method is often used in which a deep crack stop trench (not shown) is formed in the dicing region C around the die seal ring 240 surrounding the chip, in order to divide the boundary surface between the first inter-layer film 203 and the first diffusion prevention insulating film 205.

Regarding the manufacturing method of the related art, in the process of forming a hole for a bonding pad and the bonding pad, the polyimide layer 213 and the cover insulating film 212 in a specific region are etched to expose an upper surface of the upper portion 211c of the third wire 211. At the same time, the second inter-layer insulating film 206 in the fuse element formation region B and the dicing region C is etched so that part of the second inter-layer insulating film 206 remains in the fuse element formation region B.

At this time, it is preferable to simultaneously form a crack stop trench (not shown) and a hole for a bonding pad. This is because the manufacturing process can be simplified by dividing the first inter-layer film 203 in the dicing region C at the same time of forming the hole for the bonding pad.

If the etching process further proceeds after the state of FIG. 1 where the crack stop trench is formed, however, the first wire (fuse element) 204 in the fuse element formation region B is also exposed. For this reason, the moisture resistance of the semiconductor wafer 2 degrades, thereby causing defects of the semiconductor device.

To prevent this, at least the fuse element formation region B and the crack stop trench are processed using different masks. In other words, a process of etching the second inter-layer insulating film 206 in the fuse element formation region B and a process of forming the crack stop trench have to be carried out separately, which causes an increase in the number of processes and an increase in manufacturing costs. For this reason, it has been difficult to simultaneously form the crack stop trench and the hole for the bonding pad without exposing the fuse element (first wire 204).

SUMMARY

In one embodiment, a semiconductor device may include, but is not limited to: a semiconductor substrate having n element formation region and a dicing region; an element layer over the element formation region and the dicing region; and a multi-layered wiring structure over the dicing region. The multi-layered wiring structure extends upwardly from the element layer. The multi-layered wiring structure has a groove penetrating the multi-layered wiring structure.

In another embodiment, a semiconductor device may include, but is not limited to: a semiconductor substrate having an element formation region and a dicing region; an element layer over the element formation region and the dicing region; a first insulating film over the element layer; a first wiring portion penetrating the first insulating film, the first wiring portion being positioned over the element formation region; and a second insulating film covering the first wiring portion and the first insulating film. A stack of the first and second insulating films has a first groove over the dicing region. A bottom surface of the first groove is lower in level than a bottom surface of the first wiring portion.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The present invention will now be described herein with reference to illustrative embodiments. The accompanying drawings explain a semiconductor device and a method of manufacturing the semiconductor device in the embodiments. The size, the thickness, and the like of each illustrated portion might be different from those of each portion of an actual semiconductor device.

Those skilled in the art will recognize that many alternative embodiments can be accomplished using the teachings of the present invention and that the present invention is not limited to the embodiments illustrated herein for explanatory purposes.

Figure 1:
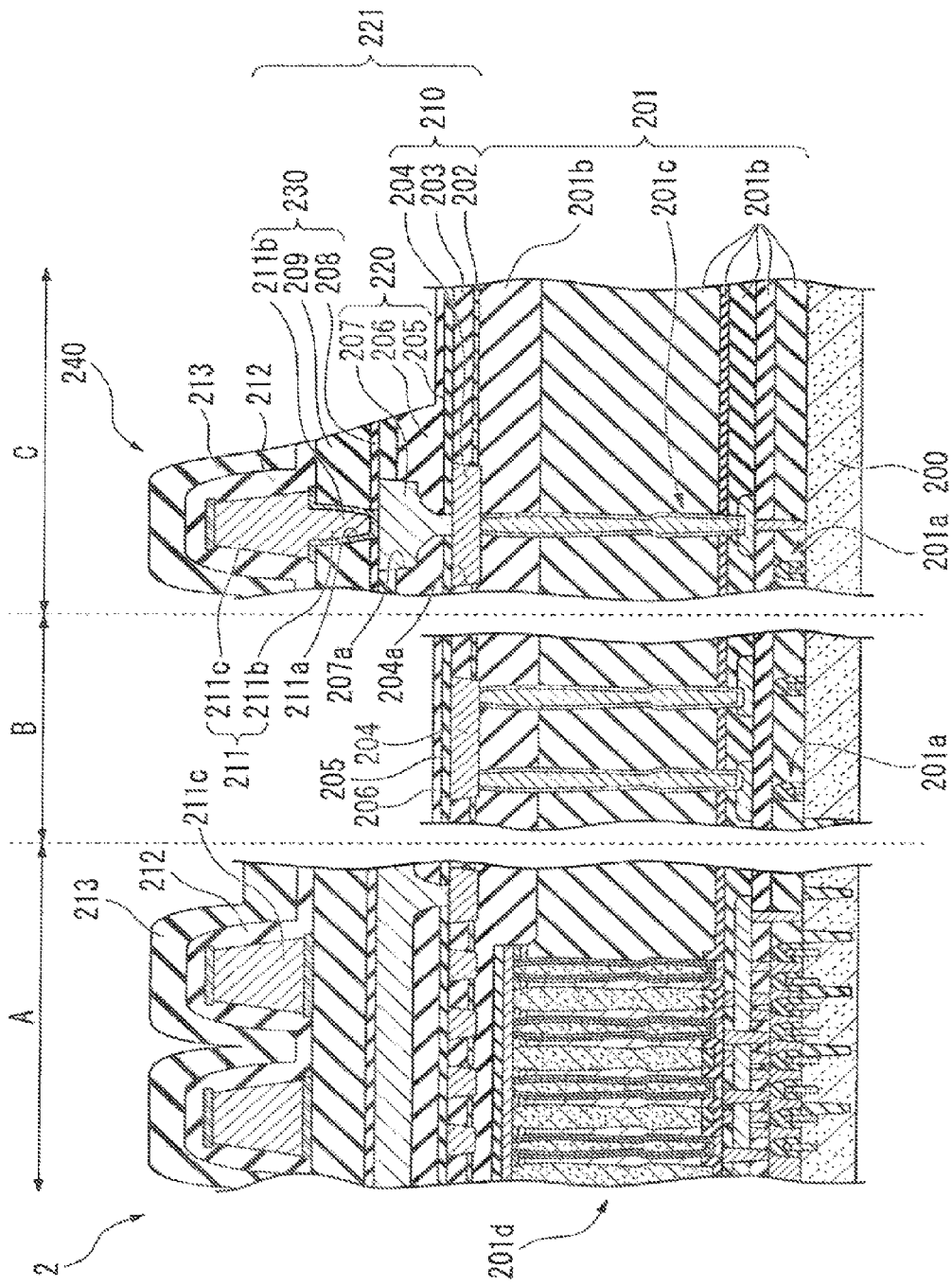
FIGS. 1 and 2 are cross-sectional views illustrating a process flow indicative of a method of manufacturing a semiconductor wafer according to a related art.
Figure 2:
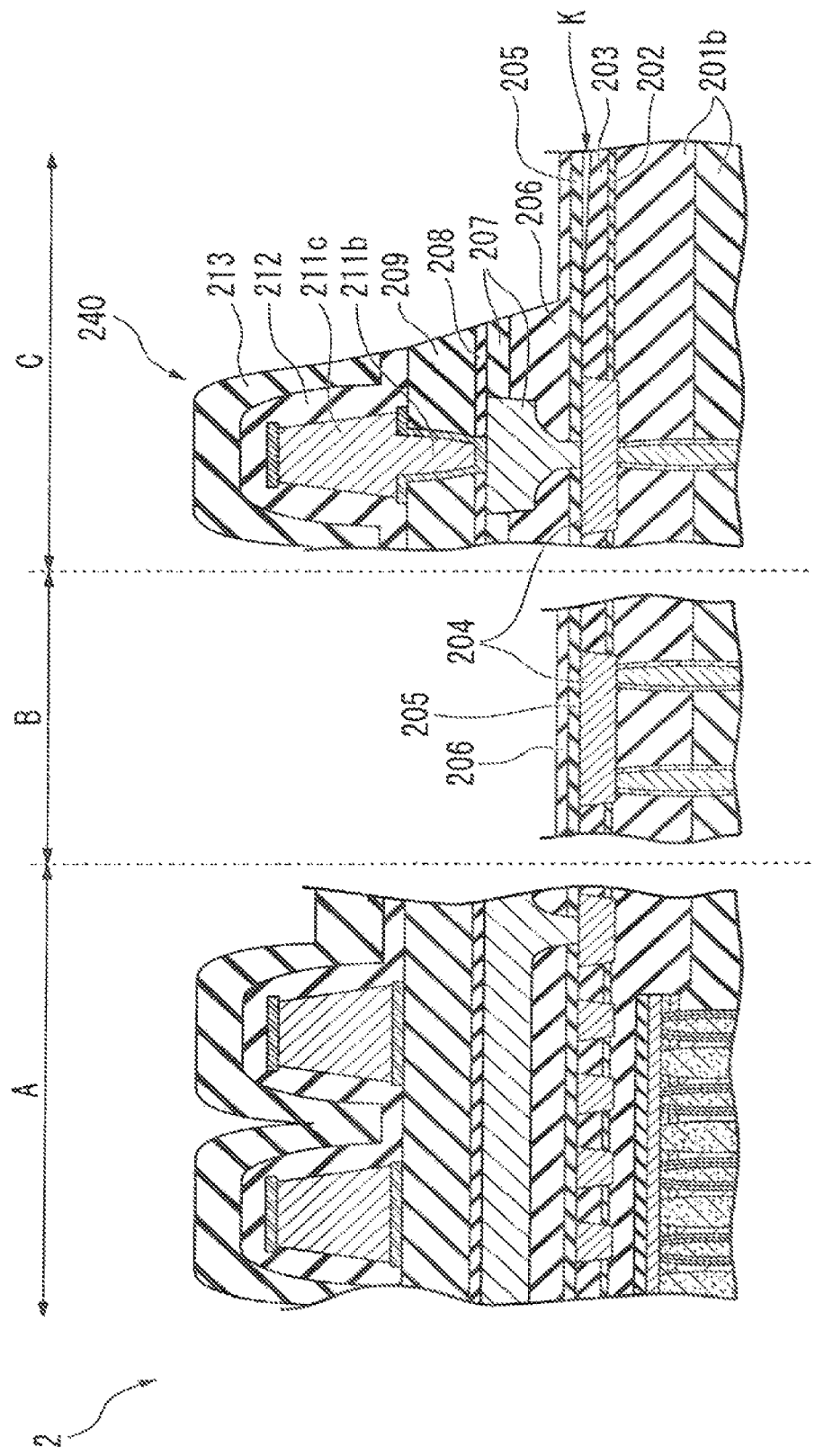
Figure 3:
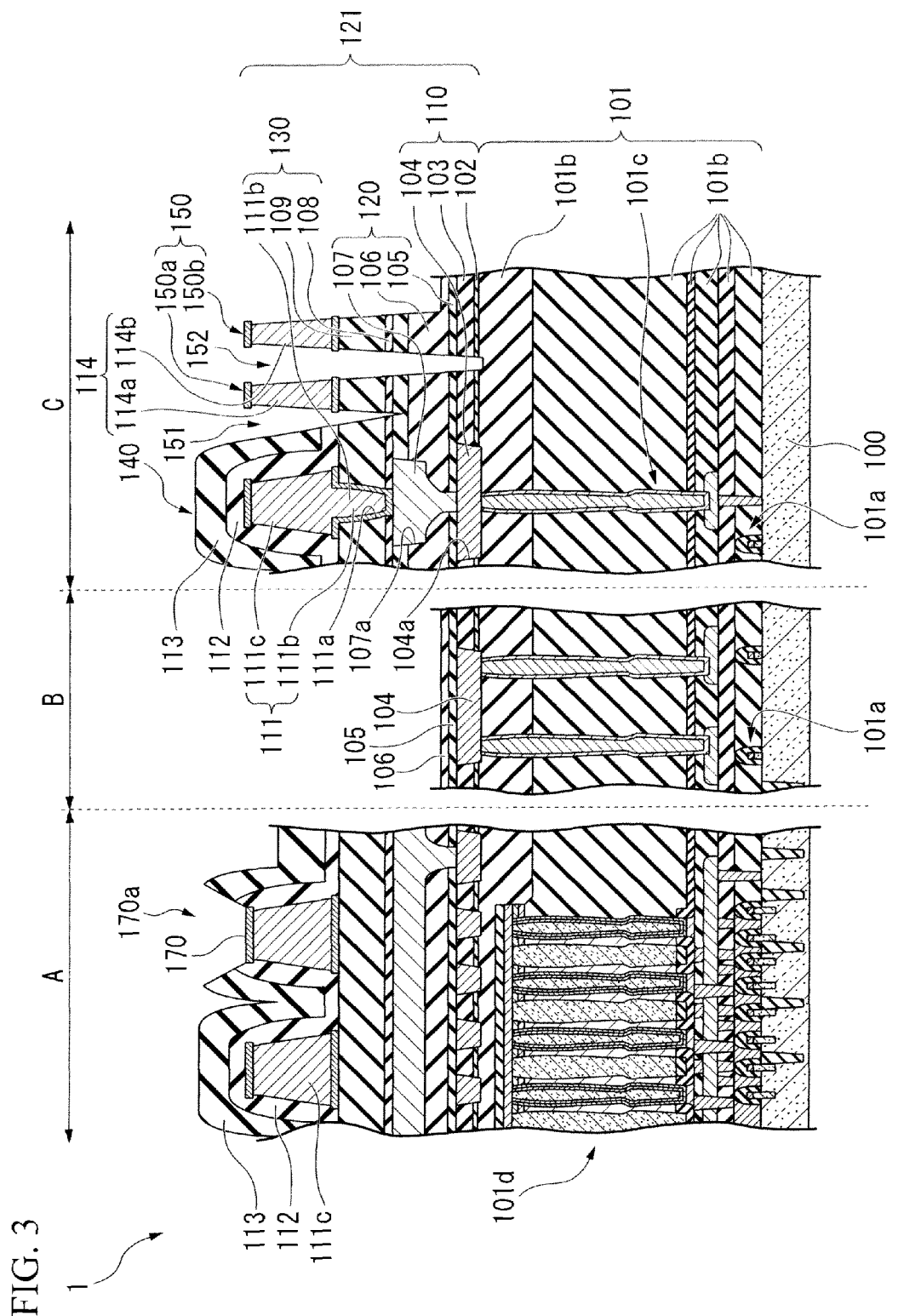
FIGS. 3 to 8 are cross-sectional views illustrating a process flow indicative of a method of manufacturing a semiconductor wafer according to a first embodiment of the present invention.

Hereinafter, a semiconductor wafer 1 according to a first embodiment of the present invention is explained with reference to FIG. 3. The semiconductor wafer 1 includes: a substrate (semiconductor substrate) 100; an element layer 101; a multi-layered wiring structure 121 (including a first wiring structure 110, a second wiring structure 120, and a third wiring structure 130); a die seal ring 140; a dummy ring 150; a crack stop trench (second trench 152); and a bonding pad 170.

The semiconductor wafer 1 has a dicing region C that defines a region including a chip region A and a fuse element formation region B. The chip region A will be a main region of a semiconductor chip after the semiconductor wafer 1 is diced. A semiconductor element, such as a MOS transistor 101a, and memory cells are formed in the substrate 100 and the element layer 101 in the chip region A.

The dicing region C surrounds the chip region A and the fuse element formation region B. A dicing line (not shown) is provided on the periphery of the dicing region C. When the semiconductor wafer 1 is diced along the dicing line, a semiconductor chip including the chip region A and the fuse element formation region B can be obtained. Hereinafter, the details of each structure are explained.

The substrate 100 is made of silicon. An element isolation structure (not shown) is formed in the substrate 100. The element layer 101 includes: semiconductor elements, such as the MOS transistor 101a and a capacitor 101d; a single-or-multi-layered inter-layer insulating film 101b over the semiconductor elements; and a contact plug 101c penetrating the inter-layer insulating film 101b.

The semiconductor elements, such as the MOS transistor 101a and the capacitor 101d, are formed on the substrate 100. The single-or-multi-layered inter-layer insulating film 101b is formed over the semiconductor elements. The structures of the MOS transistor 101a and the capacitor 101d are the same as those of the related art. Therefore, explanations thereof are omitted here.

If the semiconductor wafer 1 includes a semiconductor chip including a DRAM, multiple memory cells, each of which includes the MOS transistor 101a and the capacitor 101d, are formed in the element layer 101.

The contact plug 101c is made of a conductive material, such as Ti (titanium) and W (tungsten). The contact plug 101c vertically penetrates the inter-layer insulating film 101b in the fuse element formation region B and the dicing region C. The contact plug 101c connects the element layer 101 and a multi-layered wiring structure 121 that will be explained later.

The multi-layered wiring structure 121 includes a first wiring structure 110, a second wiring structure 120, and a third wiring structure 130. The first and second wiring structures 110 and 120 are formed in the regions A, B, and C by a damascene method. Hereinafter, the details of the first to third wiring structures 110, 120, and 130 are explained.

The first wiring structure 110 includes a first silicon nitride film 102, a first inter-layer film (first inter-layer insulating film) 103 including a low-k film, and a first wire (Cu wire) 104. The first silicon nitride film 102 covers the contact plug 101c and the uppermost inter-layer insulating film 101b. The first inter-layer film 103 including the low-k film covers the first silicon nitride film 102. The low-k film is made of Si (silicon), C (carbon), O (oxygen), or the like.

The first wire 104 functions as a fuse element in the fuse element formation region B. The first wire 104 is cut by laser irradiation or the like, and thereby a predetermined circuit operation can be carried out.

The first wire (Cu wire) 104 includes a barrier metal film and a copper film over the barrier metal film. The barrier metal film is made of Ti, Ta (tantalum), Mn (manganese), or the like. The first wire 104 penetrates the first inter-layer film 103 and the first silicon nitride film 102. The first wire 104 is connected to a top portion of the contact plug 101c.

The second wiring structure 120 includes the first diffusion prevention insulating film 105, the second inter-layer insulating film 106, and the second wire (Cu wire) 107. Preferably, the second wiring structure 120 is formed in the chip region A and the dicing region C, but not in the fuse element formation region B.

The first diffusion prevention insulating film 105 is made of a silicon nitride film or a silicon nitride film containing carbon. The first diffusion prevention insulating film 105 covers the first wire 104 and the first inter-layer film 103 including the low-k film. Any one of the silicon nitride film and the silicon nitride film containing carbon may be used as the first diffusion prevention insulating film 105. However, the silicon nitride film containing carbon can achieve a higher effect of reducing a dielectric constant than the silicon nitride film free of carbon. The first diffusion prevention insulating film 105 can prevent copper from diffusing into the second wiring structure 120.

The second inter-layer insulating film 106 covers the first diffusion prevention insulating film 105. The second wire 107 is made of a barrier metal film and a copper film over the barrier metal film. The barrier metal film is made of Ti, Ta, Mn, or the like. The second wire 107 penetrates the second inter-layer insulating film 106 and the first diffusion prevention insulating film 105. The second wire 107 is connected to a top portion of the first wire 104.

The third wiring structure 130 includes a second diffusion prevention insulating film 108, a third inter-layer insulating film 109, and a lower portion 111b of a third wire (Al wire) 111. The third wiring structure 130 is formed in the chip region A and the dicing region C, but not in the fuse element formation region B. The second diffusion prevention insulating film 108 covers the second inter-layer insulating film 106. The second diffusion prevention insulating film 108 prevents copper from diffusing into the third wiring structure 130.

The third inter-layer insulating film 109 covers the second diffusion prevention insulating film 108. The lower portion 111b of the third wire (Al wire) 111 penetrates the third inter-layer insulating film 109 and the second diffusion prevention insulating film 108. The lower portion 111b of the third wire 111 is connected to the top portion of the second wire 107. The reason that Al is used as a material of the third wire 111 is that Al has a great affinity for the bonding process.

Thus, the multi-layered structure 121, which includes the first to third wiring structures 110, 120, and 130, is formed. The wires (the first to third wires 104, 107, and 111) included in the multi-layered structure 121 functions as wires for the semiconductor elements in the element layer 101.

The die seal ring 140 includes an upper portion 111c of the third wire 111, a cover insulating film 112, and a polyimide layer 113. The upper portion 111c of the third wire 111 protrudes from the upper surface of the third inter-layer insulating film 109 by, for example, 1000 nm.

The cover insulating film 112 covers upper and side surfaces of the upper portion 111c of the third wire 111 and the third inter-layer insulating film 109. The cover insulating film 112 includes a silicon oxide film, a silicon nitride film, a silicon oxynitride film, or a multi-layered film including these films. The cover insulating film 112 has a thickness of, for example, 650 nm.

The thickness of the cover insulating film 112 has to be appropriately adjusted according to the vertical size of the upper portion 111c of the third wire 111. Preferably, the thickness of the cover insulating film 112 is 0.5 times or more the vertical size of the upper portion 111c of the third wire 111. Specifically, when the vertical size of the upper portion 111c of the third wire 111 is 1000 nm, the cover insulating film 112 need to have a thickness of 500 nm or more. A top surface of the third wire 111 formed in the chip region A is partially exposed so as to function as a bonding pad 170a.

The polyimide layer 113 covers the cover insulating film 112. The polyimide layer 113 functions as a buffer for a chip. The die seal ring 140 protrudes upwardly from the upper surface of the semiconductor wafer 1 in the chip region A and the dicing region C.

The dummy ring 150 includes an extending portion (a first extending portion 114a and a second extending portion 114b), and the inter-layer film (the third inter-layer insulating film 109, the second diffusion prevention insulating film 108, the second inter-layer insulating film 106, the first diffusion prevention insulating film 105, the first inter-layer film 103 including the low-k film), and the first silicon nitride film 102. The dummy ring 150 protrudes upwardly from the upper surface of the semiconductor wafer 1, and surrounds the die seal ring 140 in plane view.

Two or more dummy rings 150 are provided in parallel. Here, the dummy ring 150 on the side of the die seal ring 140 is called a first dummy ring 150a. The dummy ring 150 on the side of the dicing line is called a second dummy ring 150b.

The distance between the first and second dummy rings 150a and 150b has to be appropriately adjusted according to the thickness of the cover insulating film 112. Preferably, the distance between the first and second dummy rings 150a and 150b is 0.5 to 2.5 times the vertical size of the upper portion 111c of the third wire 111 included in the first and second dummy rings 150a and 150b. Specifically, when the vertical thickness of the upper portion 111c of the third wire 111 is 1000 nm, the distance between the first and second dummy rings 150a and 150b has to be in the range of approximately 500 nm to 2500 nm.

The first dummy ring 150a is disposed between the die seal ring 140 and the second dummy ring 150b. A first trench 151 is formed between the die seal ring 140 and the first dummy ring 150a. At least the third inter-layer insulating film 109 is exposed to the first trench 151. A second trench 152, which is deeper than the first trench 151, is formed between the first dummy ring 150a and the second dummy ring 150b. Specifically, a bottom surface of the second trench 152 is lower in level than a bottom surface of the first trench 151. A bottom surface of the second trench 152 is positioned in the element layer 101. A recessed portion is formed outside the second dummy ring 150b. A bottom surface of the recessed portion is higher in level than the bottom surface of the second trench 152.

The second trench 152 will be a crack stop trench. The second trench 152 is formed by removing the inter-layer film between the first and second dummy rings 150a and 150b (at least the third inter-layer insulating film 109, the second diffusion prevention insulating film 108, the second inter-layer insulating film 106, the first diffusion prevention insulating film 105, and the first inter-layer film 103). Thus, at least the first inter-layer film 103 is divided by the crack stop trench (second trench 152).

Thus, the third inter-layer insulating film 109, the second diffusion prevention insulating film 108, the second inter-layer insulating film 106, the first diffusion prevention insulating film 105, and the first inter-layer film (first inter-layer insulating film) 103 including the low-k film are divided by the crack stop trench (second trench 152) in the dicing region C.

The crack stop trench (second trench 152) surrounds the die seal ring 140. A dicing line (not shown) is defined outside the crack stop trench. The semiconductor chip of the present embodiment is obtained by dicing the semiconductor wafer 1 along the dicing line. The semiconductor chip forms the semiconductor device of the present embodiment.

Regarding the semiconductor chip of the present embodiment, a crack is formed in the multi-layered wiring structure 121 around the dicing line in some cases. Additionally, the first inter-layer film 103 and the first diffusion prevention insulating film 105, which are around the dicing line, might be removed from each other in some cases.

According to the present embodiment, however, the crack stop trench (second trench 152) is formed in the dicing region C, and thereby prevents the cracking and the removal of films from further proceeding. For this reason, a crack or removal of films does not occur in the first to third wiring structures 110, 120, and 130 in the chip region A and the fuse element formation region B.

The bonding pad hole 170a is formed by partially removing the polyimide layer 113 and the cover insulating film 112 in the chip region A. A top surface of the upper portion 111c of the third wire (Al wire) 111 is exposed to the bonding pad hole 170a, thus forming the bonding pad 170. The bonding pad is made of Al. A bonding wire (nor shown) is connected to a top portion of the bonding pad 170.

Hereinafter, a method of manufacturing the semiconductor wafer 1 of the present embodiment is explained. FIGS. 3 to 8 are cross-sectional views illustrating a process flow indicative of the method of manufacturing the semiconductor wafer 1 according to the present embodiment.

The method includes: a process of preparing the substrate 100; a process of forming the element layer 101; a process of forming the multi-layered wiring structure 121 (including the first to third wiring structures 110, 120, and 130); a process of forming the die seal ring 140; a process of forming the dummy ring 150 and the crack stop trench (second trench 152); and a process of forming the bonding pad 170. The semiconductor wafer 1 has the dicing region C that defines a region including the chip region A and the fuse element formation region B.

The process of forming the element layer 101 includes: a process of preparing the substrate 100 (having the chip region A, the fuse element formation region B, and the dicing region C); a process of forming an element isolation structure (not shown); a process of forming semiconductor elements, such as the MOS transistor 101a and the capacitor 101d; a process of forming a single-or-multi-layered inter-layer insulating film 101b; and a process of forming the contact plug 101c. However, these processes are the same as those of the related art, and therefore explanations thereof are omitted here.

When the semiconductor wafer 1 includes a semiconductor chip including a DRAM, multiple memory cells, each of which includes, for example, the MOS transistor 101a and the capacitor 101d, may be formed in the element layer 101. Then, the contact plug 101c, which is made of Ti, W, or the like, is formed so as to vertically penetrate the inter-layer insulating film 101b in the fuse element formation region B and the dicing region C. Consequently, the contact plug 101c connects the MOS transistor 101a and the multi-layered wiring structure 121 that will be explained later.

The process of forming the multi-layered wiring structure 121 includes a process of forming the first wiring structure 110, a process of forming the second wiring structure 120, and a process of forming the third wiring structure 130.

Figure 4:
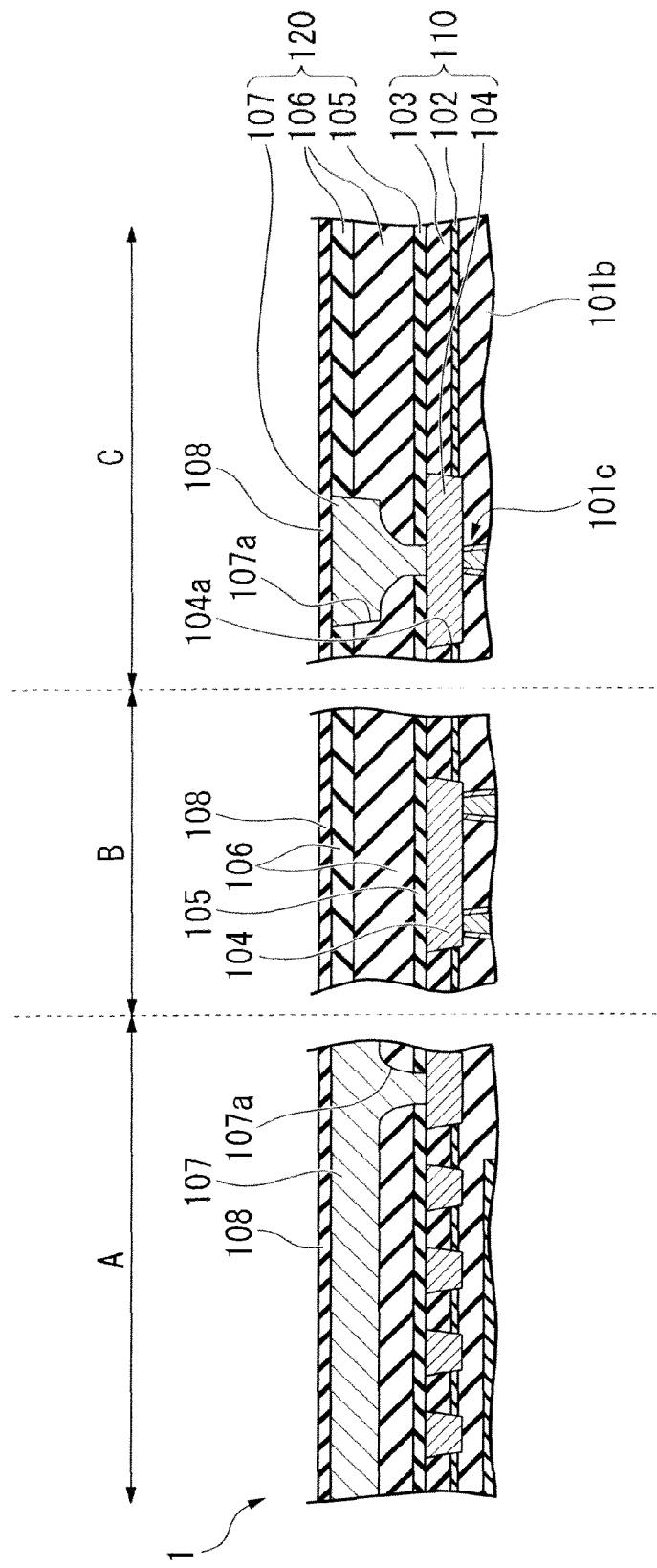

In the process of forming the first wiring structure 110, the first silicon nitride film 102 and the first inter-layer film (first inter-layer insulating film) 103 that includes a low-k film are sequentially formed in this order so as to cover the element layer 101, as shown in FIG. 4. The low-k film includes a SiCO film. Then, a first contact hole 104a is formed so as to penetrate the first inter-layer film 103 and the first silicon nitride film 102 and to expose the contact plug 101c.

Then, a barrier metal film made of Ti, Ta, Mn, or the like and a copper film are sequentially formed so as to fill the first contact hole 104a and to cover the first inter-layer film 103. Then, the barrier metal film and the copper film over the first inter-layer film 103 are polished by the CMP method to form the first wire 104 (Cu wire). Thus, a fuse element (first wire 104) is formed in the fuse element formation region B.

In the process of forming the second wiring structure 120, the first diffusion prevention insulating film 105 is formed so as to cover the upper surface of the first wire 104 and the first inter-layer film 103. The first diffusion prevention insulating film 105 is made of a silicon nitride film or a silicon nitride film containing carbon. Although a silicon nitride film or a silicon nitride film containing carbon is used as the first diffusion prevention insulating film 105, the silicon nitride film containing carbon has a better effect of reducing a dielectric constant than the silicon nitride film free of carbon. The first diffusion prevention insulating film 105 prevents copper form diffusing into the element layer 101.

Then, the second inter-layer insulating film 106 is formed so as to cover the first diffusion prevention insulating film 105 in the chip region A and the dicing region C. Then, second contact holes 107a are formed in the chip region A and the dicing region C so as to penetrate the second inter-layer insulating film 106 and the first diffusion prevention insulating film 105 and to expose the first wire 104.

Then, a barrier metal film made of Ti, Ta, Mn, or the like and a copper film are sequentially formed so as to fill the second contact holes 107a and to cover the second inter-layer film 106. Then, a CMP process is carried out. Thus, the second wires 107, which are connected to the first wires 104, are formed in the chip region A and the dicing region C.

Preferably, the second wire 107 is not formed in the fuse element formation region B. The wire (first wire 104 as a fuse element) is formed only in the first wiring structure 110, which is the deepest layer viewed form the upper surface side of the semiconductor wafer 1. Thereby, the wire (first wire 104 as the fuse element) can be certainly prevented from being exposed in the process of forming the dummy ring 150 and the crack stop trench (second trench 152) as will be explained later. For the same reason, the third wire 111 is not formed in the fuse element formation region B.

Figure 5:
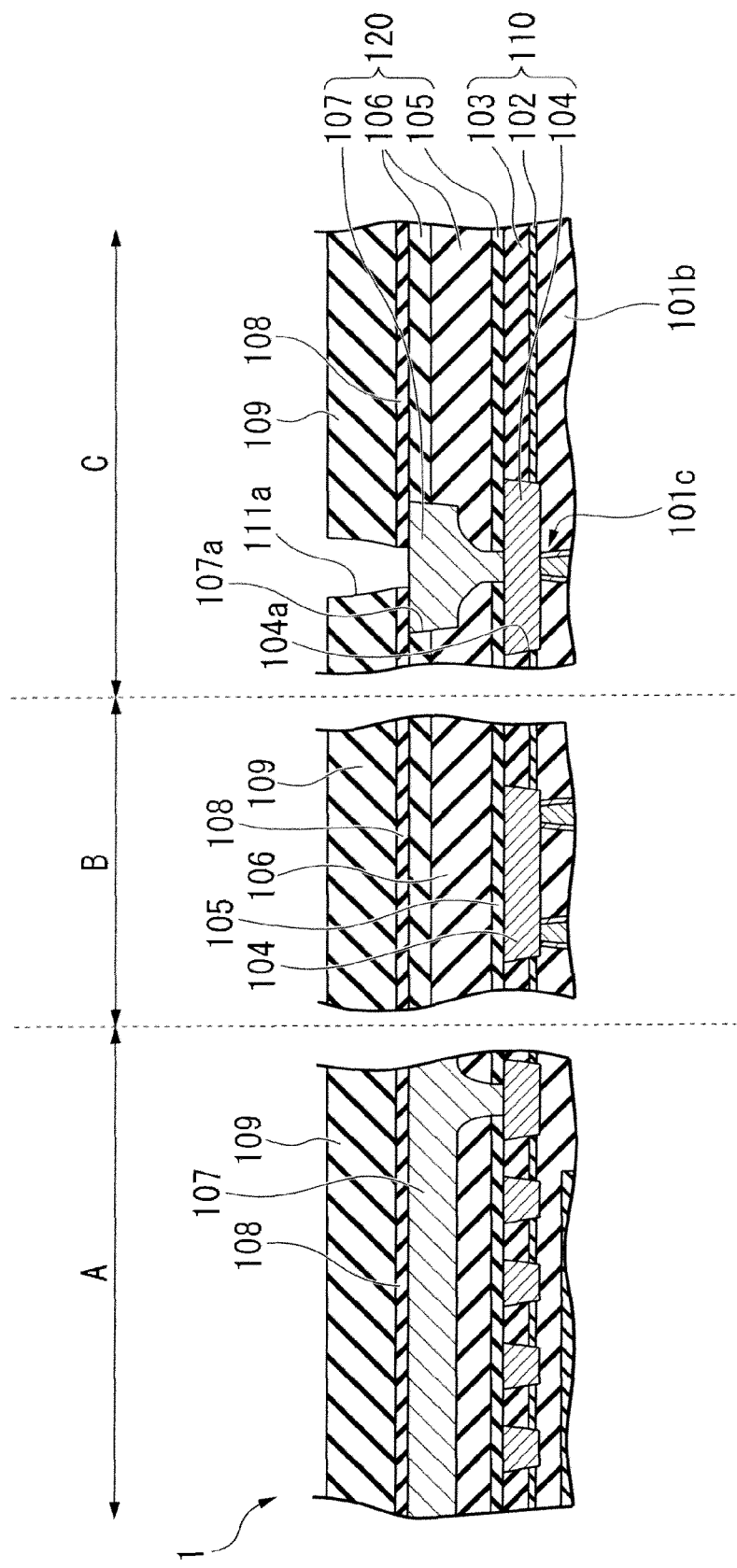

In the process of forming the third wiring structure 130, the second diffusion prevention insulating film 108 is formed so as to cover the upper surface of the second wire 107 and the second inter-layer insulating film 106, as shown in FIG. 4. Then, the third inter-layer insulating film 109 is formed so as to cover the second diffusion prevention insulating film 108, as shown in FIG. 5. Then, a third contact hole 111a is formed so as to penetrate the third inter-layer insulating film 109 and the second diffusion prevention insulating film 108 in the dicing region C and to expose the second wire 107.

Then, a multi-layered film, which is made of Ti, Al, or the like, is formed so as to fill the third contact hole 111a and to cover the third inter-layer insulating film 109. A thickness of the multi-layered film is, for example, 1000 nm. Then, the multi-layered film made of Ti, Al, or the like is patterned by a dry etching process.

Figure 6:
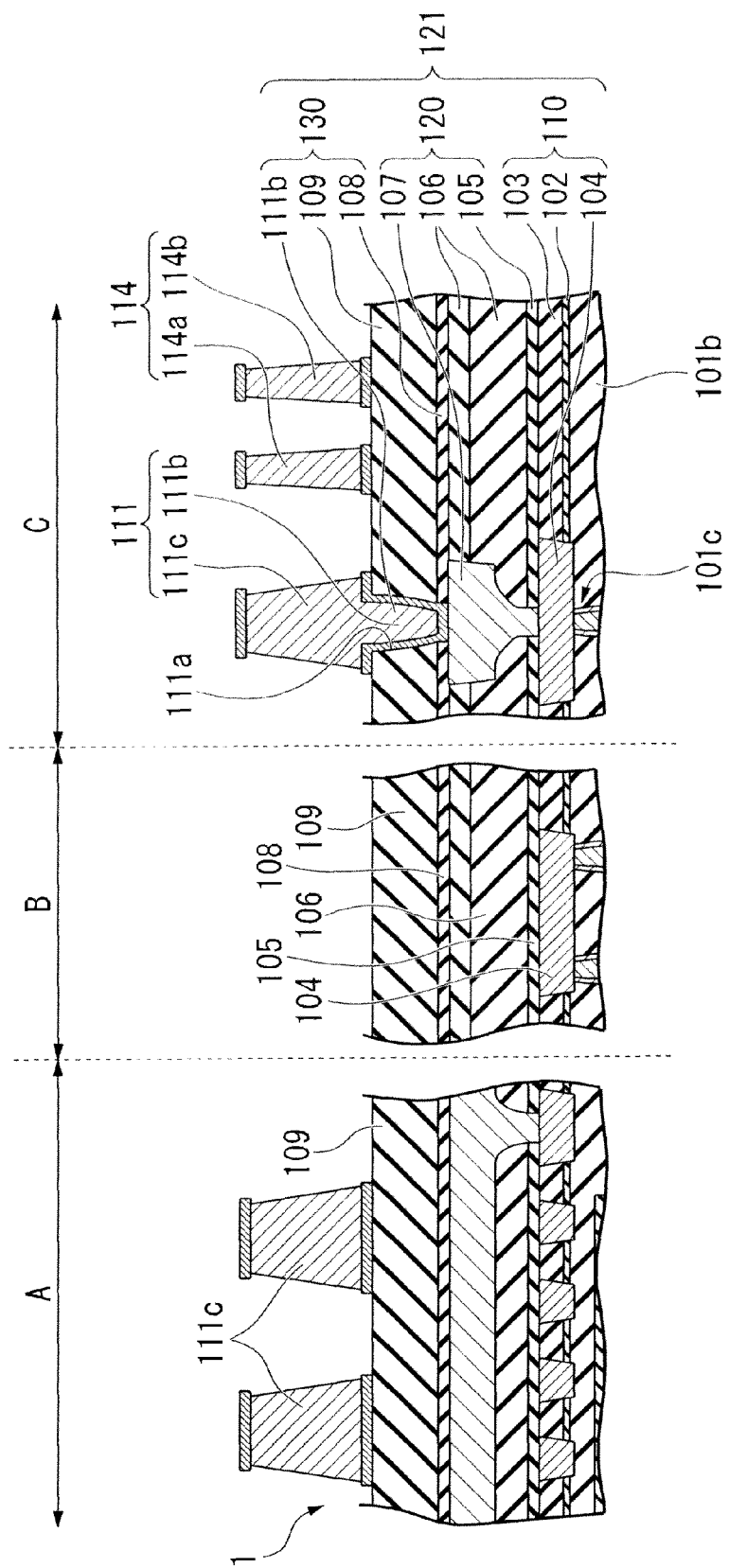

Thus, the upper portion 111c of the third wire (Al wire) 111 is formed on the third inter-layer insulating film 109 in the chip region A, as shown in FIG. 6. The vertical size of the upper portion 111c of the third wire 111 is, for example, 1000 nm. At the same time, the third wire 111 including the lower portion 111b and the upper portion 111c, and the extending portion 114 are formed in the dicing region C. As a method of forming a contact plug (not shown), a CVD-W film may be formed so as to fill the contact hole and be divided to form the third wire 111.

At this time, the extending portion 114 made of Al has substantially the same top level as the upper portion 111c of the third wire 111. The extending portion 114 protrudes from the upper surface of the third inter-layer insulating film 109. Additionally, two or more extending portions 114 are formed in parallel. Here, the extending portion 114 on the side of the chip region A is called the first extending portion 114a. The extending portion 114 on the side of the dicing line is called the second extending portion 114b.

The extending portion 114 surrounds the die seal ring 140 in the dicing region C. The extending portion 114 is made of Al, and therefore can be used as an etching mask in the process of forming the crack stop trench (second trench 152) as will be explained later.

At this time, the distance between the first and second extending portions 114a and 114b achieves a sufficient anti-microloading effect upon formation of a crack stop trench using a method that will be explained later. For this reason, the distance therebetween is set to be 0.5 to 2.5 times the vertical size of the upper portion 111c of the third wire 111.

To provide a sufficient amount of etchant into the trench portion, the width of each of the first and second extending portions 114a and 114b is preferably set to be at least 0.5 times or more the vertical size of the extending portion 114, which is 500 nm or more in this case. The upper limit may be any value as long as not affecting the area of the chip and the processability of the dicing process.

The third wire (Al wire) 111 in the dicing region C is connected to the second wire 107. The lower portion 111b of the third wire 111 penetrates the third inter-layer insulating film 109 and the second diffusion prevention insulating film 108. The upper portion 111c of the third wire 111 protrudes from the upper surface of the third inter-layer insulating film 109 by, for example, 1000 nm. The reason that Al is used as the material of the third wire 111 is that Al has a great affinity for the bonding process that will be explained later.

Thus, the multi-layered wiring structure 121 is formed. The wires (first to third wires 104, 107, and 111) in the multi-layered wiring structure 121 function as wires for semiconductor elements in the element layer 101. In the fuse element formation region B, the wires (first wire 104 as a fuse element) are formed only in the first wiring structure 110.

Figure 7:
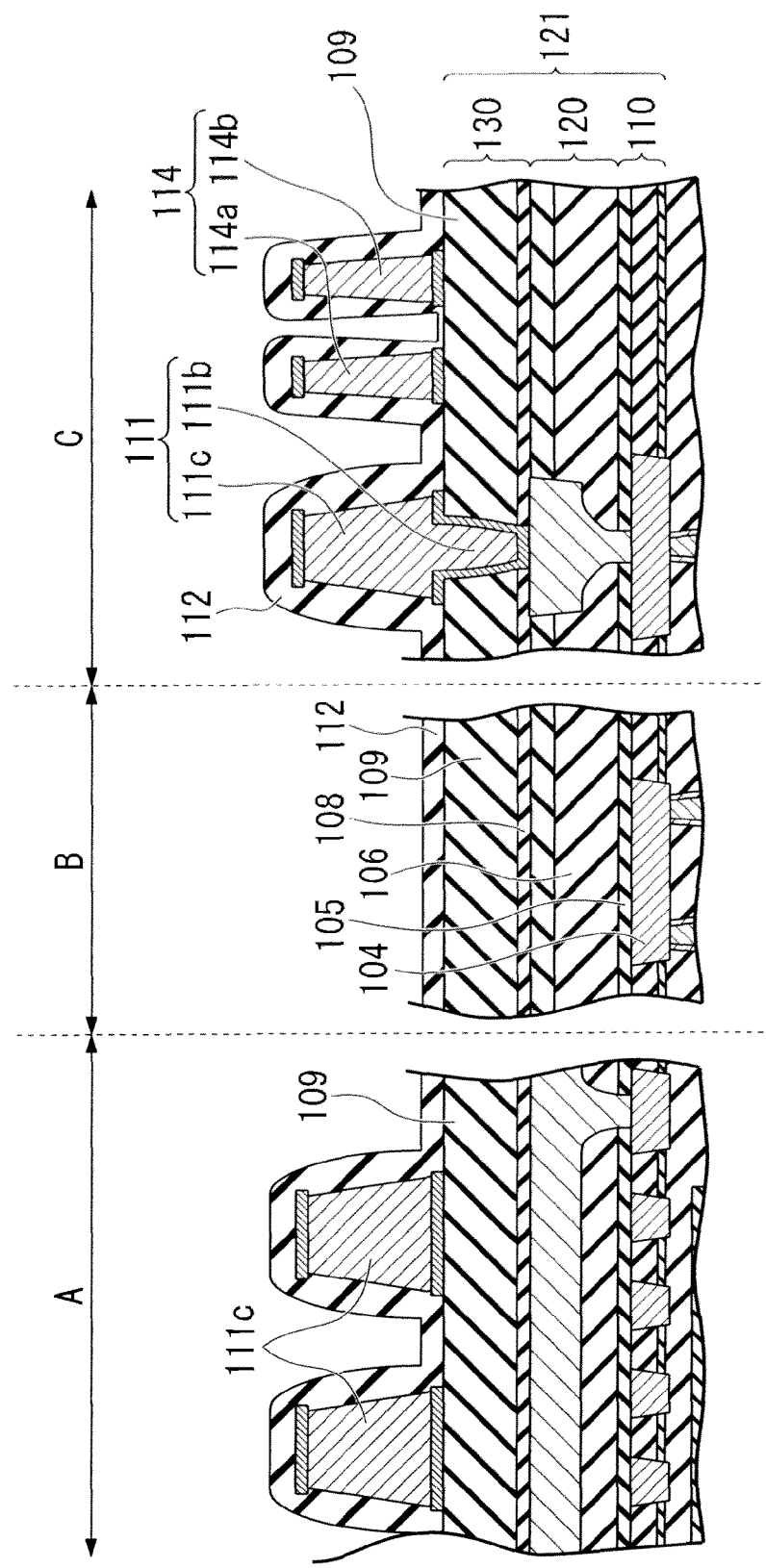
Figure 8:
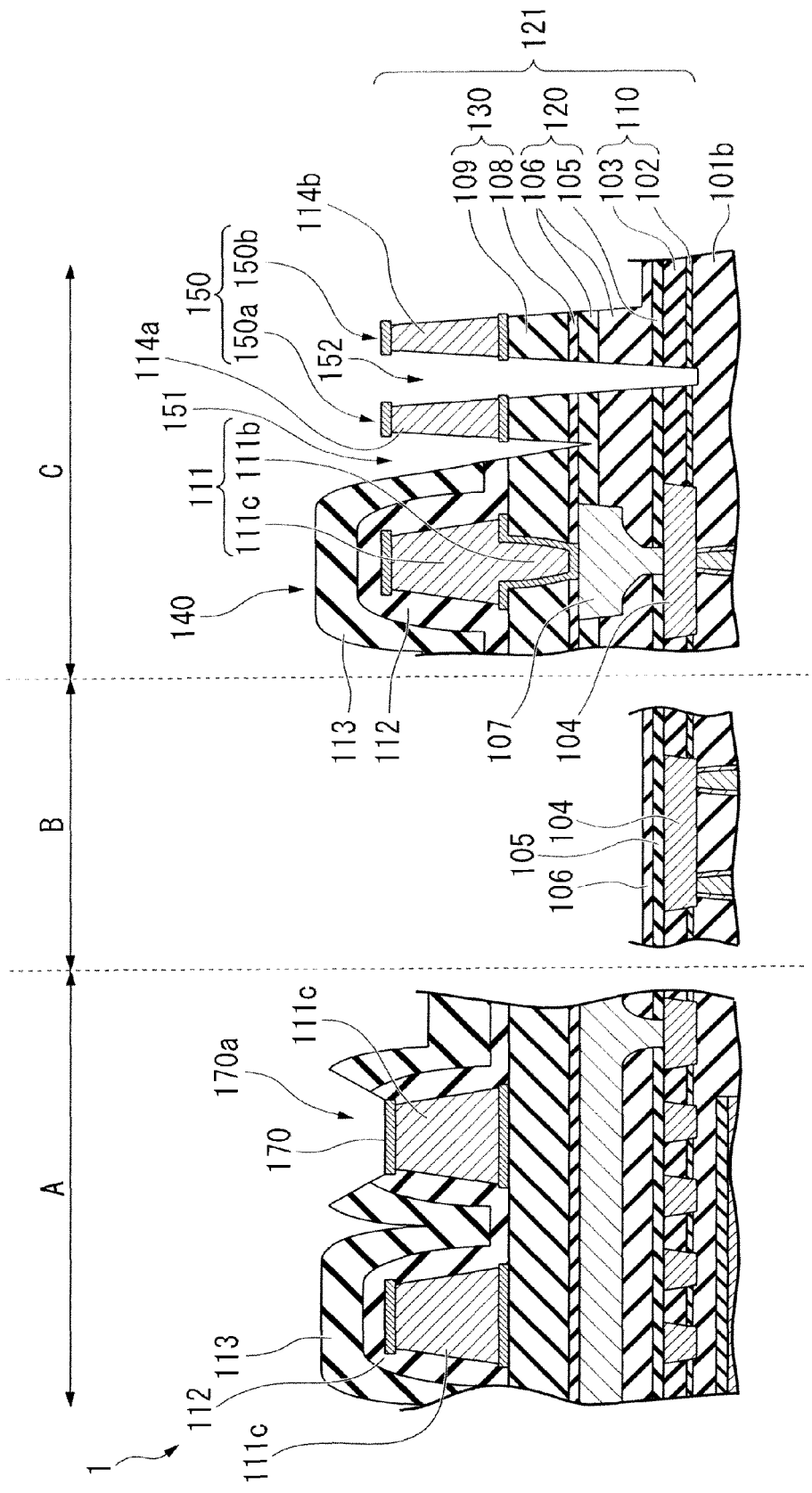

In the process of forming the die seal ring 140, the cover insulating film 112 is formed so as to cover the upper portion 111c of the third wire 111 in the chip region A and the extending portion 114, as shown in FIG. 7. The cover insulating film 112 includes a silicon oxide film, a silicon nitride film, a silicon oxynitride film, or a multi-layered film including these films. The thickness of the cover insulating film 112 is, for example, 650 nm.

At this time, the thickness of the cover insulating film 112 is preferably 0.5 times or more the vertical size of the upper portion 111c of the third wire 111. When the vertical size of the upper portion 111e of the third wire 111 is 1000 nm, the thickness of the cover insulating film 112 has to be 500 nm or more. The thickness of the cover insulating film 112 is appropriately adjusted according to the vertical size of the upper portion 111c of the third wire 111. The cover insulating film 112 achieves a moisture-proof effect, and can prevent diffusion of metal, such as Na and Fe provided from the outside.

As the conditions of forming the cover insulating film 112, a plasma CVD method using TEOS (tetraethoxysilane) or $SiH_4$ (mono-silane) is preferably used. As the plasma CVD method, a parallel plate or HDP method can be used.

Then, the polyimide layer 113 is formed so as to cover the cover insulating film 112. The polyimide layer 113 functions as a buffer for the chip. Thus, the die seal ring 140, which protrudes from the upper surface of the semiconductor wafer 1, is formed in the chip region A and the dicing region C.

In the process of forming the dummy ring 150 and the crack stop trench (second trench 152), a portion of the polyimide layer 113 which covers the bonding pad 170 in the chip region A, a portion of the polyimide layer 113 which covers the extending portion 114 in the dicing region C, and a portion of the polyimide layer 113 which is included in the fuse element formation region B, are removed to partially expose the cover insulating film 112. Then, a dry etching process is carried out using the polyimide layer 113, the first extending portion 114a, and the second extending portion 114b as masks.

Thus, in the chip region A, a portion of the cover insulating film 112, which covers the bonding pad 170, is removed by the etching process. In the fuse element formation region B, the cover insulating film 112 and the inter-layer film underlying the cover insulating film 112 (i.e., the third inter-layer insulating film 109, the second diffusion prevention insulating film 108, the second inter-layer insulating film 106, and the first inter-layer insulating film 103) are etched. In the fuse element formation region B, a thickness of the inter-layer insulating film covering the first wire 104 is reduced, thereby a dicing process using laser irradiation can be easily carried out.

At this time, the anti-microloading effect occurs since the distance between the first and second extending portions 114a and 114b is narrower than the distance between the adjacent upper portions 111c of the third wires 111. Accordingly, a process of etching the inter-layer film between the first and second extending portions 114a and 114b (third inter-layer insulating film 109, the second diffusion prevention insulating film 108, the second inter-layer insulating film 106, the first diffusion prevention insulating film 105, and the first inter-layer film 103) proceeds faster than a process of etching the peripheral portion of the extending portion 114.

Since a portion of the cover insulating film 112 between the first and second extending portions 114a and 114b is thinner than other portions, a process of etching the inter-layer film between the first and second extending portion 114a and 114b starts prior to a process of etching the inter-layer film in the fuse element formation region B.

Accordingly, the inter-layer film between the first and second extending portions 114a and 114b (third inter-layer insulating film 109, the second diffusion prevention insulating film 108, the second inter-layer insulating film 106, the first diffusion prevention insulating film 105, the first inter-layer film 103, and the first silicon nitride film 102) is also removed. Consequently, the crack stop trench (second trench 152) surrounding the die seal ring 140 is formed by self-alignment.

Accordingly, the bottom surface of the crack stop trench (second trench 152) is lower n level than the upper surface of h use element formation region B. The film down to the first silicon nitride film 102 is divided by the crack stop trench.

Thus, the dummy ring 150, which includes the first and second dummy rings 150a and 150b, is formed by removing the inter-layer film between and outside the first and second extending portions 114a and 114b. Accordingly, the dummy ring 150 includes the extending portions 114 (first and second extending portions 114a and 114b) and the inter-layer film (third inter-layer insulating film 109, the second diffusion prevention insulating 108, the second inter-layer insulating film 106, the first diffusion prevention insulating film 105, the first inter-layer film 103, and the first silicon nitride film 102). The dummy ring 150 protrudes from the surface of the semiconductor wafer 1, and surrounds the peripheral portion of the die seal ring 140 in the dicing region C.

At this time, the inter-layer in the fuse element formation region B (third inter-layer insulating film 109, the second diffusion prevention insulating film 108, and the second inter-layer insulating film 106) is also etched. However, at least the first diffusion prevention insulating film 105 among the inter-layer films over the wire (first wire 104 as the fuse element) remains without being etched. For this reason, the crack stop trench (second trench 152) can be formed without exposing the wire (first wire 104 as the fuse element) in the fuse element formation region B.

In the present embodiment, the bottom surface of the crack stop trench (second trench 152) is deeper in level than the bottom surface of the first wire 104 in the fuse element formation region B. However, the level difference cannot be made greater. For this reason, in the fuse element formation region B, the wire (first wire 104 as the fuse element) is formed only in the first wiring structure 110, which is the deepest among the multi-layered wiring structure 121, thereby preventing the wire from being exposed.

At this time, the second wire 107 can be formed in the second wiring structure 120 in the fuse element formation region B. If the etching process is carried out such that the second wire 107 is not exposed in the fuse element formation region B, however, the crack stop trench (second trench 152) cannot be formed with a sufficient depth. For this reason, it becomes difficult for the crack stop trench (second trench 152) to divide the first inter-layer film 103.

At the same time with formation of the crack stop trench (second trench 152), the first trench 151, which is shallower than the crack stop trench (second trench 152), is formed between the die seal ring 140 and the first extending portion 114a. The first trench 151 is formed by removing at least the third inter-layer insulating film 109.

At the same time, the inter-layer film outside the second dummy ring 150b is removed, and thereby a recessed portion is formed. In this case, the bottom surface of the recessed portion is higher in level than the bottom surface of the second trench 152.

At the same time, a portion of the cover insulating film 112, which covers the bonding pad 170, is removed, and thereby the bonding pad hole 170a is formed. The upper surface of the upper portion 111c of the third wire 111, which is exposed to the bonding pad hole 170a, will be the bonding pad 170.

In the process of forming the bonding pad 170, a bonding wire (not shown) is connected to the upper surface of the upper portion 111c of the third wire 111, which is exposed to the bonding pad hole 170a. Since the bonding pad 170 is made of Al, the bonding process can be carried out with high affinity. Thus, the bonding pad 170 is formed.

Then, the semiconductor wafer 1 is diced along the dicing lines in the dicing region C. Thus, semiconductor chips can be obtained. At this time, cracking or removal of inter-layer films from each other (not shown) occurs in the multi-layered wiring structure 121 on the side of the dicing line. However, the crack stop trench (second trench 152) prevents the cracking and the removal of inter-layer films from proceeding further. For this reason, the cracking or the removal of inter-layer films on the side of the dicing line does not affect the wiring structures (first to third wiring structures 110, 120, and 130) in the chip region A and the fuse element formation region B. Accordingly, the semiconductor wafer 1, the semiconductor chip, and the semiconductor device including the semiconductor chip can be provided with higher reliability.

According to the present embodiment, two or more extending portions 114 (first and second extending portions 114a and 114b) are formed in the dicing region C such that the distance between the adjacent extending portions 114 is smaller than that between the adjacent upper portions 111c of the third wires 111. Accordingly, a portion of the cover insulating film 112 between the first and second extending portions 114a and 114b can be formed thinner than other portions. Therefore, the inter-layer film between the first and second extending portions 114a and 114b can be etched faster than the inter-layer film in the fuse element formation region B.

Additionally, the anti-microloading effect can be achieved by etching the inter-layer film in the dicing region C using the extending portion 114 as a mask. Accordingly, the etching of the inter-layer film between the first and second extending portions 114a and 114b can proceed faster than the etching of the inter-layer film in the other regions.

As explained above, the crack stop trench (second trench 152) can be formed at the same time with formation of the bonding pad hole 170a without exposing the wire (first wire 104 as the fuse element) in the fuse element formation region B.

According to the above manufacturing method, the crack stop trench (second trench 152) is formed by etching, by self-alignment, the inter-layer film between the first and second extending portions 114a and 114b. For this reason, the horizontal width of the crack stop trench (second trench 152) can be substantially the same as the distance between the first and second extending portions 114a and 114b. Accordingly, a reduction in the number of semiconductor chips to be manufactured from one wafer can be prevented without decreasing the effective area of the chip region A.

Additionally, the crack stop trench (second trench 152) prevents cracking and removal of inter-layer films caused by the dicing process from further proceeding toward the chip region A. For this reason, the inter-layer films are not removed from each other in the multi-layered wiring structure 121 in the chip region A, thereby preventing a decrease in the moisture resistance of the semiconductor chip.

Further, according to the semiconductor wafer 1 of the present embodiment, the crack stop trench (second trench 152) surrounds the chip region A. Additionally, the dicing line is provided outside the crack stop trench (second trench 152). Accordingly, the crack stop trench (second trench 152) can function as a crack stopper upon the dicing process.

Moreover, the crack stop trench (second trench 152) is formed between the two or more dummy rings 150. Thus, the crack stop trench (second trench 152) is surrounded by the dummy rings 150, and thereby effectively functions as a mark for the dicing process, compared to the case where only the crack stop trench (second trench 152) is formed.

As explained above, the crack stop trench (second trench 152) can be formed in the same process of forming the bonding pad hole 170a without increasing the number of processes and manufacturing costs compared to the related art. Accordingly, a decrease in the moisture resistance and the quality of the semiconductor device can be prevented by the smaller number of processes. The shape of the dummy ring 150 and the thickness of the cover insulating film 112 can be adjusted without reducing the cost and the reliability of products.

The present invention is suitable to a manufacturing method in the case where the multi-layered wiring structure includes a low-k film. Even if the multi-layered film does not include a low-k film, however, the present invention is applicable to the case where multiple insulating films are deposited to form an inter-layer insulating film. Even in the case where the multi-layered film does not include a low-k film, the crack stop trench and the bonding pad hole can be simultaneously formed using the present invention.

As used herein, the following directional terms "forward," "rearward," "above," "downward," "vertical," "horizontal," "below," and "transverse," as well as any other similar directional terms refer to those directions of an apparatus equipped with the present invention. Accordingly, these terms, as utilized to describe the present invention should be interpreted relative to an apparatus equipped with the present invention.

The terms of degree such as "substantially," "about," and "approximately" as used herein mean a reasonable amount of deviation of the modified term such that the end result is not significantly changed. For example, these terms can be construed as including a deviation of at least ±5 percent of the modified term if this deviation would not negate the meaning of the word it modifies.

It is apparent that the present invention is not limited to the above embodiments, and may be modified and changed without departing from the scope and spirit of the invention.

What is claimed is:

1. A semiconductor device comprising:
    a semiconductor substrate having an element formation region and a dicing region;
    an element layer over the element formation region and the dicing region; and
    a multi-layered wiring structure over the dicing region, the multi-layered wiring structure extending upwardly from the element layer,
    the multi-layered wiring structure having a first groove penetrating the multi-layered wiring structure,
    the multi-layered wiring structure having a top wiring, wherein side regions of the top wiring are exposed by the first groove.

2. The semiconductor device according to claim 1, wherein a bottom surface of the first groove is positioned in the element layer.

3. The semiconductor device according to claim 1, wherein the multi-layered wiring structure comprises first and second wiring portions separated by the first groove, wherein the multi-layered wiring structure comprises a second groove, wherein a depth of the first groove is larger than a depth of the second groove, and wherein each depth of the first and second grooves is measured from a top surface of the multi-layered wiring structure to a far end of the first and second grooves.

4. The semiconductor device according to claim 1, wherein the multi-layered wiring structure comprises a low-k film, wherein the low-k film includes a Silicon, a Carbon and an Oxygen.

5. The semiconductor device according to claim 1, wherein the top wiring comprising an aluminum film.

6. A semiconductor device comprising:
    a semiconductor substrate having an element formation region and a dicing region;
    a film at least formed over the dicing region;
    a first groove formed in the film over the dicing region;
    a second groove formed in the film over the dicing region positioned between the element formation region and the first groove, a depth of the second groove being larger than a depth of the first groove, and each depth of the first and second grooves being measured from a top surface of the film to a far end of the first and second grooves.

7. The semiconductor device according to claim 6, further comprising an element layer over the element formation region and the dicing region, and wherein a bottom surface of the first groove is positioned in the element layer.

8. The semiconductor device according to claim 7, wherein the film comprises a first insulating film over the element layer, a second insulating film over the first insulating film, a first wiring and a second wiring separated by the first groove, and the first wiring and the second wiring extend upwardly from the second insulating film over the dicing region.

9. The semiconductor device according to claim 8, further comprising:

a third wiring over the dicing region, the third wiring extending upwardly from the second insulating film, the third wiring being closer to the element formation region than the second wiring.

10. The semiconductor device according to claim 9, wherein:

a first distance between the first and second wiring being smaller than a second distance between the second and third wiring.

11. The semiconductor device according to claim 9, further comprising:

a third insulating film covering at least upper and side surfaces of the third wiring.

12. The semiconductor device according to claim 11, wherein a thickness of the third insulating film is 0.5 times or more the vertical size of the second wiring.

13. The semiconductor device according to claim 8, further comprising:

a fourth wiring over the element formation region, the fourth wiring extending upwardly from the second insulating film, a fifth wiring over the element formation region, the fifth wiring extending upwardly from the second insulating film.

14. The semiconductor device according to claim 13, wherein an upper surface of the fourth wiring is exposed.

15. The semiconductor device according to claim 13, wherein the first, second, third, fourth, and fifth wirings comprise an aluminum film.

16. The semiconductor device according to claim 8, wherein the first insulting film comprises a Silicon, a Carbon and an Oxygen.

17. The semiconductor device according to claim 8, wherein the first and second wiring have substantially the same vertical size.

18. The semiconductor device according to claim 8, wherein each of the horizontal sizes of the first and second wiring is 0.5 times or more the vertical size of the second wiring.

19. The semiconductor device according to claim 8, wherein side regions of the first wiring and the second wiring are exposed.

20. The semiconductor device according to claim 8, wherein the first insulating film has a dielectric constant smaller than 3.9.

* * * * *